(12) United States Patent
Suzuki (10) Patent No.: US 7,459,395 B2
(45) Date of Patent: Dec. 2, 2008

(54) METHOD FOR PURIFYING A METAL CARBONYL PRECURSOR

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 343 days.

(21) Appl. No.: 11/238,501

(22) Filed: Sep. 28, 2005

(65) Prior Publication Data

US 2007/0072401 A1    Mar. 29, 2007

(51) Int. Cl.
*H01L 21/44* (2006.01)
(52) U.S. Cl. .................................. 438/681; 427/252
(58) Field of Classification Search ............... 438/584, 438/680, 681, 685, 686; 427/252
See application file for complete search history.

(56) References Cited

U.S. PATENT DOCUMENTS

| | | | |
|---|---|---|---|
| 5,108,983 A | 4/1992 | Lackey, Jr. et al. | 505/1 |
| 5,312,509 A | 5/1994 | Eschbach | 156/345 |
| 5,553,395 A | 9/1996 | Wen et al. | 34/359 |
| 5,904,771 A | 5/1999 | Tasaki et al. | 117/105 |
| 5,914,001 A | 6/1999 | Hansen | 156/345 |
| 6,303,809 B1 | 10/2001 | Chi et al. | 556/136 |
| 6,319,832 B1 | 11/2001 | Uhlenbrock et al. | 438/681 |
| 6,428,623 B2 | 8/2002 | Westmoreland et al. | 118/715 |
| 6,440,495 B1 | 8/2002 | Wade et al. | 427/250 |
| 6,444,263 B1 * | 9/2002 | Paranjpe et al. | 427/250 |
| 6,544,345 B1 | 4/2003 | Mayer et al. | 134/28 |
| 6,605,735 B2 | 8/2003 | Kawano et al. | 556/136 |
| 6,660,328 B1 | 12/2003 | Dahmen et al. | 427/248.1 |
| 6,701,066 B2 | 3/2004 | Sandhu | 392/386 |
| 6,713,373 B1 | 3/2004 | Omstead | 438/608 |
| 6,718,126 B2 | 4/2004 | Lei | 392/388 |
| 6,740,586 B1 | 5/2004 | Wang et al. | 438/680 |
| 7,297,719 B2 * | 11/2007 | Suzuki | 518/700 |

(Continued)

FOREIGN PATENT DOCUMENTS

EP    0620291 A1    10/1994

(Continued)

OTHER PUBLICATIONS

European Patent Office, International Search Report and Written Opinion of corresponding PCT Application No. PCT/US2006/007675, dated Oct. 13, 2006, 9 pages.

*Primary Examiner*—Alexander G Ghyka
*Assistant Examiner*—Reema Patel
(74) *Attorney, Agent, or Firm*—Wood, Herron & Evans, LLP (57) ABSTRACT

A method of purifying a metal carbonyl precursor in a metal precursor vaporization system where the metal carbonyl precursor comprises a metal particulate impurity. The method includes flowing a CO-containing gas through the metal precursor vaporization system to a precursor collection system in fluid communication with the metal precursor vaporization system to separate the metal carbonyl precursor from the metal particulate impurity and to transfer the metal carbonyl precursor to the precursor collection system, and collecting the transferred metal carbonyl precursor in the precursor collection system, where an amount of the metal particulate impurity is lower in the precursor collection system than in the precursor vaporization system and the precursor collection system is maintained at a lower temperature than the metal precursor vaporization system. A metal carbonyl precursor parameter may be monitored to determine a status of the metal carbonyl precursor and the need for purifying the metal carbonyl precursor.

20 Claims, 5 Drawing Sheets

U.S. PATENT DOCUMENTS

| | | | |
|---|---|---|---|
| 2003/0129306 A1 | 7/2003 | Wade et al. | 427/255.28 |
| 2004/0013577 A1 | 1/2004 | Ganguli et al. | 422/129 |
| 2004/0105934 A1 | 6/2004 | Chang et al. | 427/255.28 |
| 2004/0241321 A1 | 12/2004 | Ganguli et al. | 427/255.28 |
| 2005/0081882 A1 | 4/2005 | Greer et al. | 134/1.1 |
| 2005/0110142 A1 | 5/2005 | Lane et al. | 257/751 |
| 2005/0186341 A1 | 8/2005 | Hendrix et al. | 427/248.1 |
| 2006/0068098 A1* | 3/2006 | Yamasaki et al. | 427/248.1 |
| 2006/0224008 A1* | 10/2006 | Suzuki et al. | 556/136 |

FOREIGN PATENT DOCUMENTS

| | | |
|---|---|---|
| EP | 0 714 999 A1 | 6/1996 |
| WO | WO 0026432 A1 | 5/2000 |
| WO | WO 2004/010463 A2 | 1/2004 |
| WO | WO 2005034223 A1 | 4/2005 |

* cited by examiner

METHOD FOR PURIFYING A METAL CARBONYL PRECURSOR

CROSS REFERENCE TO RELATED APPLICATIONS

The present invention is related to U.S. patent application Ser. No. 10/996,145, entitled "METHOD FOR INCREASING DEPOSITION RATES OF METAL LAYERS FROM METAL-CARBONYL PRECURSORS," U.S. patent application Ser. No. 10/996,144, entitled "METHOD AND DEPOSITION SYSTEM FOR INCREASING DEPOSITION RATES OF METAL LAYERS FROM METAL-CARBONYL PRECURSORS," and U.S. patent application Ser. No. 11/095,448, entitled "METHOD AND SYSTEM FOR REFURBISHING A METAL-CARBONYL PRECURSOR," the entire contents of which are herein incorporated by reference.

FIELD OF THE INVENTION

The present invention relates to materials processing, and more particularly, to a method and a system for purifying a metal carbonyl precursor used for deposition of a metal or metal-containing layer on a substrate.

BACKGROUND OF THE INVENTION

Manufacturing of integrated circuits includes deposition of various materials onto patterned substrates such as silicon wafers. These materials include metal and metal-containing layers, for example diffusion barriers/liners to prevent diffusion of copper (Cu) conducting layers into dielectric materials and seed layers to promote adhesion and growth of the Cu layers onto the substrate. As the minimum feature sizes of patterned substrates continue to shrink, deposition processes are required that can provide advanced layers onto high-aspect ratio structures at sufficiently low temperatures.

Chemical vapor deposition (CVD) has seen increasing use for preparation of coatings and thin layers in semiconductor wafer processing. CVD is a favored deposition method in many respects, for example, because of its ability to provide highly conformal and high quality layers at relatively fast processing times. Further, CVD is beneficial in depositing layers on substrates of irregular shapes including the provision of highly conformal layers even with respect to deep contacts and other openings. In general, CVD techniques involve the delivery of gaseous precursors (reactants) to the surface of a substrate where chemical reactions take place under temperature and pressure conditions that are favorable to the thermodynamics of the desired reaction. The type and composition of layers that can be formed using CVD can be affected by the ability to deliver the reactants or reactant precursors to the surface of the substrate.

In order for the device manufacturing process to be practical, the deposition processes need to be carried out in a reasonable amount of time. This requirement can necessitate efficient delivery of a precursor containing a metal element from a metal precursor vaporization system to a process chamber containing the substrate(s) to be processed. A common problem encountered in the deposition of metals and metal-containing materials by CVD techniques are low deposition rates onto a substrate due to low vapor pressure of the metal-containing precursor and the transport issues associated therewith, thereby making the deposition process impractical. A low vapor pressure can limit the flow of the metal-containing precursor from the metal precursor vaporization system through gas lines to a process chamber of a deposition system where a substrate is exposed to the metal-containing precursor.

The delivery of metal-containing precursors in CVD processing can be carried out using the sublimator/bubbler method where the precursor is usually placed in a metal precursor vaporization system which is then heated to transform the precursor into a gaseous compound (vapor) which is then transported into the process chamber, often using a carrier gas. However, this procedure has not been able to reliably and reproducibly deliver the precursor to the process chamber for a number of reasons. The major problems with the technique are centered on the inability to consistently vaporize a solid precursor at a controlled rate such that a reproducible flow of precursor vapor can be delivered to the process chamber. Also it is difficult to ensure complete saturation of the fast moving carrier gas stream because of the limited amount of exposed surface area of the solid precursor in the metal precursor vaporization system and a lack of uniform temperature to provide maximum sublimation/evaporation. In addition, the temperature to which the solid precursor can be heated to provide adequate vapor pressure can be limited by premature decomposition of the precursor at that temperature. Decomposition or partial reaction of the solid precursor in the metal precursor vaporization system can further complicate the precursor delivery due to low or negligible vapor pressure of the partially reacted precursor compared to the un-reacted (fresh) precursor.

SUMMARY OF THE INVENTION

The present invention provides a method for purifying a metal carbonyl precursor used for depositing a metal or metal-containing layer on a substrate. Embodiments of the invention allow for purifying the metal carbonyl precursor by separating metal carbonyl precursor from a metal particulate impurity. According to an embodiment of the invention, a carbon monoxide (CO) gas is flowed through the metal carbonyl precursor to separate and transfer the metal carbonyl precursor from the metal particulate impurity. The CO gas allows for increasing the sublimation/evaporation temperature by reducing premature thermal decomposition of the metal carbonyl precursor, thereby permitting efficient separation of the metal carbonyl precursor from the metal particulate impurity.

Thus, where a metal precursor vaporization system contains a metal carbonyl precursor containing metal carbonyl precursor in combination with an undesired level of a metal particulate impurity, the method includes flowing a CO-containing gas through the metal precursor vaporization system to a precursor collection system in fluid communication with the metal precursor vaporization system to separate the metal carbonyl precursor from the metal particulate impurity and to transfer the metal carbonyl precursor to the precursor collection system, and collecting the transferred metal carbonyl precursor in the precursor collection system, where an amount of the metal particulate impurity is lower in the precursor collection system than in the precursor vaporization system prior to the separation, transfer and collection, and the precursor collection system is maintained at a lower temperature than the metal precursor vaporization system.

DETAILED DESCRIPTION OF SEVERAL EMBODIMENTS

Embodiments of the current invention provide a method and system for purifying a metal carbonyl precursor that may be used for depositing a metal or metal-containing layer on a substrate in a deposition system. Exemplary deposition systems can, for example, be any of the process chambers and metal precursor vaporization systems described in co-pending U.S. patent application Ser. No. 10/996,145, entitled METHOD FOR INCREASING DEPOSITION RATES OF METAL LAYERS FROM METAL-CARBONYL PRECURSORS, and U.S. patent application Ser. No. 10/996,144, entitled METHOD AND DEPOSITION SYSTEM FOR INCREASING DEPOSITION RATES OF METAL LAYERS FROM METAL-CARBONYL PRECURSORS, each filed Nov. 23, 2004 and the entire contents of which are herein incorporated by reference.

According to embodiments of the invention, the metal carbonyl precursor can, for example, have the general formula $M_x(CO)_y$, (where M is a metal, CO is carbon monoxide, and x and y are integers). The metal carbonyl precursor can include a tungsten carbonyl, a molybdenum carbonyl, a cobalt carbonyl, a rhodium carbonyl, a rhenium carbonyl, a chromium carbonyl, or an osmium carbonyl, or a combination of two or more thereof. These metal carbonyls can include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof. Below, embodiments of the invention describe the use of a solid metal carbonyl precursor, however, those skilled in the art will appreciate that metal carbonyl precursors that are liquids under the selected heating conditions can be used without departing from the scope of the invention.

In the co-pending U.S. patent application Ser. No. 11/095,448, entitled "METHOD AND SYSTEM FOR REFURBISHING A METAL-CARBONYL PRECURSOR," the inventors realized that partial decomposition of a metal carbonyl precursor in a heated metal precursor vaporization system can contribute to the inability to provide a reproducible flow of un-reacted metal carbonyl precursor vapor to a process chamber for depositing a metal or metal-containing layer on a substrate. A fresh metal carbonyl precursor can, over time, partially decompose in the heated metal precursor vaporization system, thereby forming a partially decomposed precursor (e.g., $M_x(CO)_{y-z}$, where $z \geq 1$). Since the un-reacted precursor and partially decomposed precursor can have different vapor pressures, the precursor vapor cannot be reliably and reproducibly sublimated/evaporated in the metal precursor vaporization system and delivered to the process chamber. In addition, metal-containing precursors can contain expensive precious metals, thus requiring that the partially reacted precursor be separated from the un-reacted precursor and recycled for producing a fresh precursor batch.

Embodiments of the invention described in the Ser. No. 11/095,448 application provide a method and system for separating un-reacted metal carbonyl precursor from partially reacted metal carbonyl precursor in a metal precursor vaporization system without the use of liquid solvents. According to an embodiment of the invention, a CO-containing gas is flowed through the metal carbonyl precursor to transfer and separate the un-reacted metal carbonyl precursor from the partially reacted metal carbonyl precursor. The use of the CO-containing gas allows for increasing the sublimation/evaporation temperature by reducing premature thermal decomposition of the metal carbonyl precursor, thereby permitting efficient separation and transfer of the un-reacted metal carbonyl precursor from a metal precursor vaporization system to a precursor collection system where the un-reacted metal carbonyl precursor is collected. The collected un-reacted metal carbonyl precursor can then be utilized for depositing a layer on a substrate in the process chamber and the partially reacted metal carbonyl precursor remaining in the metal precursor vaporization system may be recycled to form a fresh precursor batch.

More recently, the current inventors have realized that as-received batches of $Ru_3(CO)_{12}$ precursor from chemical vendors contained one or more metal particulate impurities as contaminants. These metal particulate impurities included Ru and iron (Fe) materials. The metal particulate impurities were non-volatile or had low volatility compared to the $Ru_3(CO)_{12}$ precursor, but it was observed that when a carrier gas was flowed through the metal precursor vaporization system, a significant number of the metal particulate impurities were transferred to the process chamber along with the $Ru_3(CO)_{12}$ vapor, resulting in unacceptably high levels of accumulated metal particulate impurities on a substrate during processing in the process chamber. As is well known to those skilled in the art of manufacturing of integrated circuits, the presence of metal particulate impurities on the substrate can destroy devices formed from the substrate.

The current inventors have realized that purifying a metal carbonyl precursor by efficiently separating the metal carbonyl precursor from any metal particulate impurities prior to substrate processing in a process chamber can greatly reduce the number of detrimental metal particulate impurities that are transferred in the gas phase to the process chamber with the metal carbonyl vapor and a carrier gas.

Embodiments of the invention provide a method for purifying a metal carbonyl precursor containing a metal particulate impurity in a metal precursor vaporization system. According to an embodiment of the invention, a CO-containing gas is flowed through the metal carbonyl precursor to transfer and separate the metal carbonyl precursor from the metal particulate impurity. The use of the CO-containing gas allows for increasing the sublimation/evaporation temperature by reducing premature thermal decomposition of the metal carbonyl precursor, thereby permitting efficient separation and transfer of the metal carbonyl precursor from a metal precursor vaporization system to a precursor collection system where the metal carbonyl precursor is collected as a purified metal carbonyl precursor. The purified metal carbonyl precursor can then be utilized for depositing a layer on a substrate in the process chamber, where the use of the purified metal carbonyl precursor results in a greatly reduced number of metal particulate impurities on the substrate compared to using the as-received metal carbonyl precursor.

According to an embodiment of the invention, the metal particulate impurity can contain the same metal as the metal carbonyl precursor, for example a Ru particulate impurity in a solid $Ru_3(CO)_{12}$ precursor. In another example, the metal particulate impurity can contain a different metal than found in the metal carbonyl precursor, for example Fe particulate impurity in a solid $Ru_3(CO)_{12}$ precursor. In general, the metal particulate impurity can contain any metal or metal-containing material (e.g., metal oxide, metal nitride, metal carbide), including, but not limited to, transition metals, alkali metals, and alkali earth metals.

In the following description, in order to facilitate a thorough understanding of the invention and for purposes of explanation and not limitation, specific details are set forth, such as a particular geometry of the metal precursor vaporization system and descriptions of various components. However, it should be understood that the invention may be practiced in other embodiments that depart from these specific details.

Figure 1A:
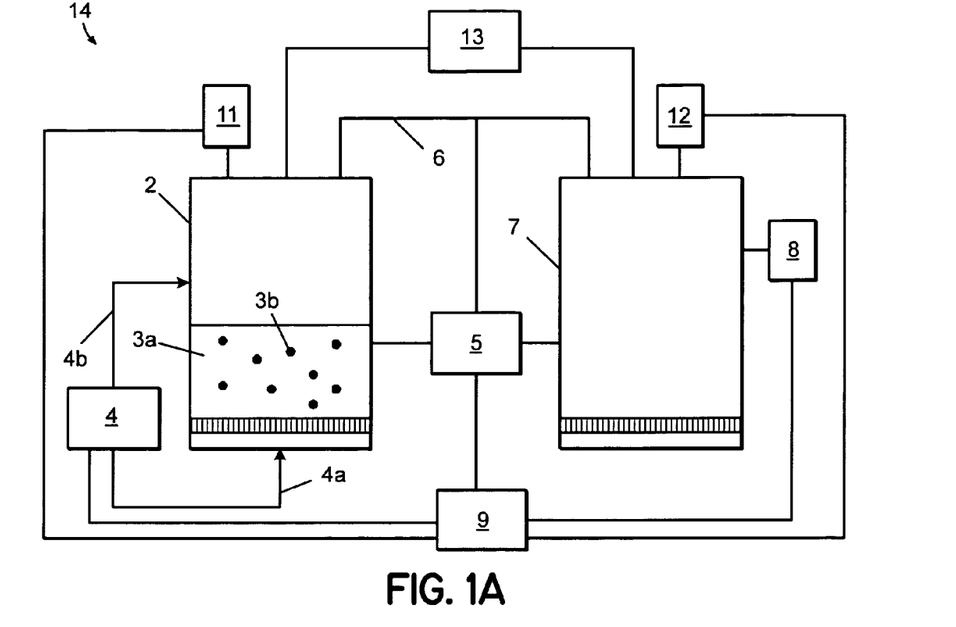
FIGS. 1A-1C each depict a schematic view of a system for purifying a metal carbonyl precursor according to an embodiment of the invention.
Figure 1B:
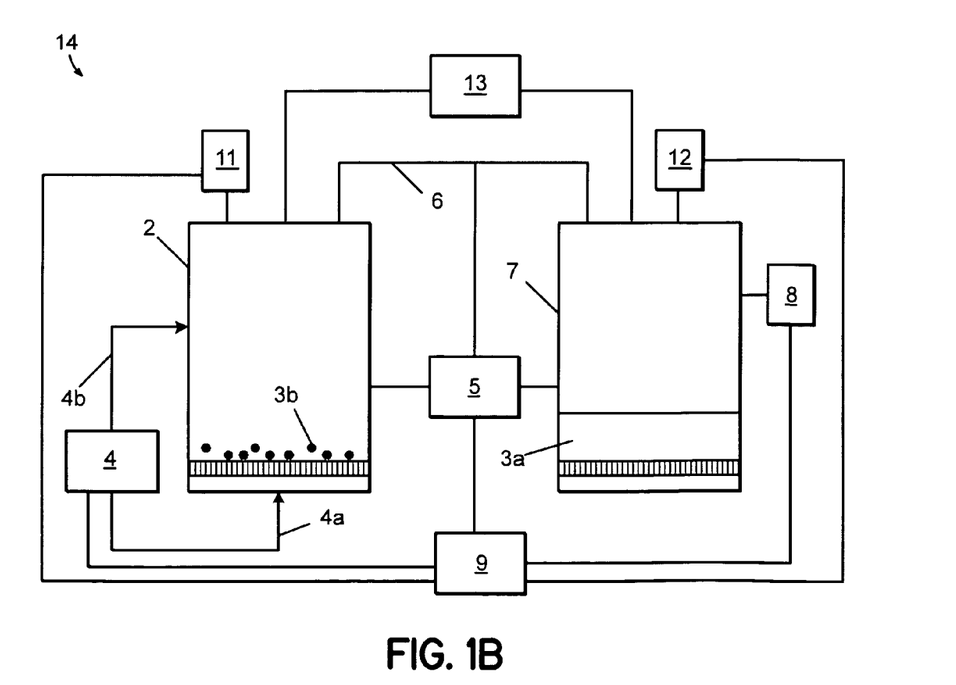
Figure 1C:
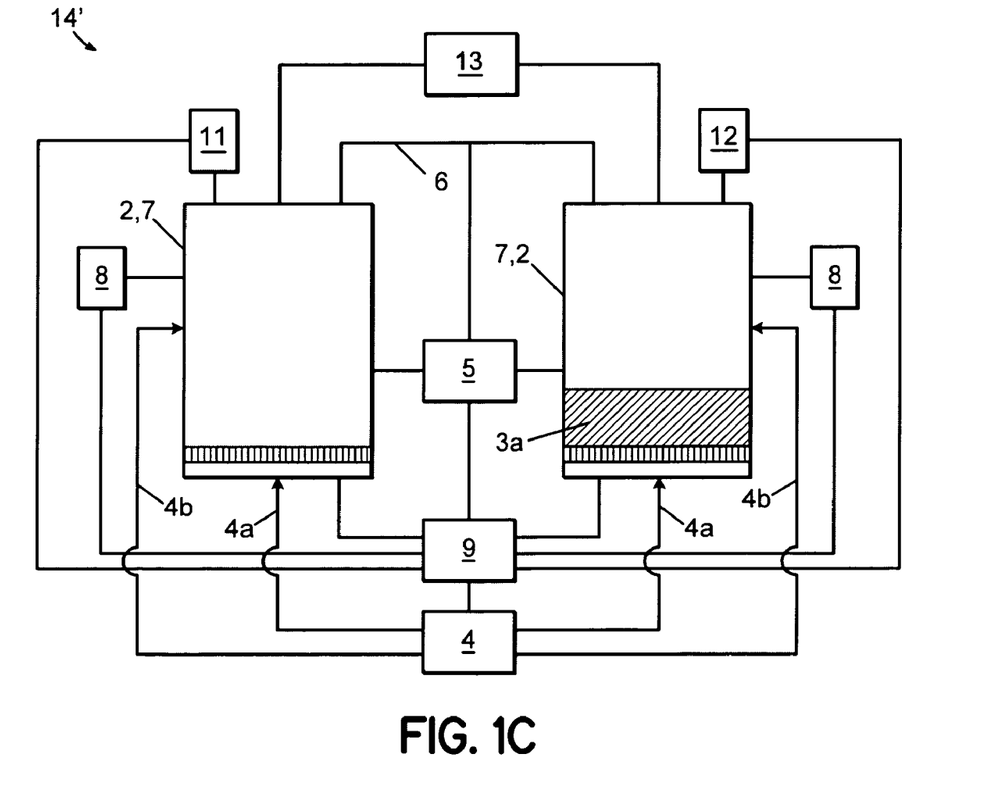

Referring now to the drawings, where like reference numerals are used to refer to like parts, FIGS. 1A-1C each depict a schematic view of a system for purifying a metal carbonyl precursor according to embodiments of the invention. In FIG. 1A, the purifying system 14 contains a metal precursor vaporization system 2 loaded with a metal carbonyl precursor 3a containing a metal particulate impurity 3b. The metal precursor vaporization system 2 is coupled to a process chamber 13 configured for depositing a metal or metal-containing layer on a substrate, but this is not required for the invention. In general, the metal precursor vaporization system 2 can be any container capable of evaporating/subliming the metal carbonyl precursor 3a.

Embodiments of the invention are now described for a solid ruthenium carbonyl precursor $Ru_3CO_{12}$. However, as those skilled in the art will appreciate, embodiments of the invention are not limited to the use of $Ru_3CO_{12}$, as other ruthenium carbonyl and metal carbonyl precursors may be used. The metal precursor vaporization system 2 and the process chamber 13 can, for example, be any of the metal precursor vaporization systems and process chambers described in the above-mentioned co-pending U.S. patent application Ser. Nos. 10/996,145 and 10/996,144.

In order to achieve the desired temperature for subliming/evaporating the ruthenium carbonyl precursor 3a, the metal precursor vaporization system 2 is coupled to an vaporization temperature control system 5 configured to control the vaporization temperature. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. The vaporization temperature can, for example, be between about 40° C. and about 150° C. for $Ru_3CO_{12}$, and can be about 80° C.

Still referring to FIG. 1A, a gas supply system 4 is coupled to the metal precursor vaporization system 2, and it is configured to supply a carrier gas beneath the ruthenium carbonyl precursor 3a via feed line 4a, and/or over the ruthenium carbonyl precursor 3a via feed line 4b. The flow of the carrier gas can be controlled using a mass flow controller (MFC) coupled to the feed lines 4a and 4b between the gas supply system 4 and the metal precursor vaporization system 2. According to embodiments of the invention, the carrier gas includes a carbon-monoxide-containing (CO-containing) gas. In addition to CO, the carrier gas can optionally contain an inert gas such as $N_2$ or a noble gas, for example argon (Ar).

A precursor collection system 7 is in fluid communication with the metal precursor vaporization system 2 via a delivery line 6 for gas phase transfer of $Ru_3CO_{12}$ precursor from the metal precursor vaporization system 2 to the precursor collection system 7. The delivery line 6 and the precursor collection system 7 are coupled to the vaporization temperature control system 5. Alternatively, multiple temperature control systems may be used to control the temperatures of the metal precursor vaporization systems 2, the precursor collection system 7, and the delivery line 6. A vacuum pumping system 8 is configured for evacuating the metal precursor vaporization system 2 and the precursor collection system 7 through the delivery line 6. The vacuum pumping system 8 can be configured for evacuating the metal precursor vaporization system 2 and the precursor collection system 7 to a pressure between about 0.1 mTorr and about 760 Torr, or to a pressure between about 10 mTorr and about 500 m Torr. Pressure monitoring systems 11, 12 are configured for monitoring the pressure in the metal precursor vaporization system 2 and the precursor vaporization system 7, respectively. Alternatively, more than one vacuum pumping system may be used to evacuate the metal precursor vaporization system 2 and the precursor collection system 7.

A control system 9 is configured to operate and control the operation of the purifying system 14. The control system 9 includes a microprocessor, a memory, and a digital I/O port capable of generating control voltages sufficient to communicate with and activate inputs of the purifying system 14 as well as monitor outputs from the purifying system 14. Moreover, the control system 9 is coupled to and exchanges information with the metal precursor vaporization system 2, the precursor collection system 7, the vaporization temperature control system 5, the delivery line 6, the pumping system 8, the gas supply system 4, and the pressure monitoring systems 11, 12. A program stored in the memory is utilized to control the aforementioned components of purifying system 14 according to a stored process recipe. The control system 9 may be implemented as a general-purpose computer, digital signal process, etc.

The control system 9 may be locally located relative to the purifying system 14 or it may be remotely located relative to the purifying system 14 via an Internet or intranet. Thus, the control system 9 can exchange data with the purifying system 14 using at least one of a direct connection, an intranet, or the Internet. The control system 9 may be coupled to an intranet at a customer site (i.e., a device maker, etc.), or coupled to an intranet at a vendor site (i.e., an equipment manufacturer). Furthermore, another computer (i.e., controller, server, etc.) can access the control system 9 to exchange data via at least one of a direct connection, an intranet, or the internet.

Metal precursor vaporization systems utilized for providing $Ru_3(CO)_{12}$ vapor have contemplated operating within a temperature range of approximately 40° C. to 45° C. for $Ru_3(CO)_{12}$ precursor under vacuum conditions in order to prevent decomposition, which occurs at higher temperatures. For example, $Ru_3(CO)_{12}$ can decompose at elevated temperatures to form by-products, such as those illustrated below:

$$Ru_3(CO)_{12}(s) \Leftrightarrow Ru_3(CO)_x(s) + (12-x)CO(g) \qquad (1)$$

or, $$Ru_3(CO)_x(ad) \Leftrightarrow 3Ru(s) + xCO(g) \qquad (2)$$

thereby forming a mixture of $Ru_3(CO)_{12}$, $Ru_3(CO)_x$, and possibly Ru in the metal precursor vaporization system. The low vapor pressure of $Ru_3(CO)_{12}$ and the small process window, can results in very low deposition rate of a Ru layer on the substrate. In the above-mentioned co-pending applications, the inventors realized that a CO-containing carrier gas can be used to reduce dissociation of the $Ru_3(CO)_{12}$ precursor, thereby allowing for heating the $Ru_3(CO)_{12}$ precursor to a high temperature (e.g., 80° C., or higher) which increases the vapor pressure of the $Ru_3(CO)_{12}$ precursor, without significant decomposition of the $Ru_3(CO)_{12}$ precursor vapor during the transport to a process chamber.

In the current invention, the current inventors have realized that a CO-containing gas can be utilized to effectively separate and transfer $Ru_3(CO)_{12}$ from metal precursor vaporization system containing $Ru_3(CO)_{12}$ and a metal particulate impurity. Further, the use of a CO-containing gas reduces dissociation of the $Ru_3(CO)_{12}$ precursor, thereby shifting the equilibrium in Equation. (1) to the left and reducing premature decomposition of the $Ru_3(CO)_{12}$ precursor while allowing for heating the $Ru_3(CO)_{12}$ precursor to higher temperature than is possible without a CO-containing gas. It is believed that addition of the CO gas to the $Ru_3(CO)_{12}$ precursor vapor allows for increasing the vaporization temperature from approximately 40° C. to approximately 150° C., or higher. The elevated temperature increases the vapor pressure of the $Ru_3(CO)_{12}$ precursor, resulting in increased transfer of the $Ru_3(CO)_{12}$ from the metal precursor vaporization system 2 to the precursor collection system 7 via the gas line 6.

FIG. 1B shows the $Ru_3(CO)_{12}$ precursor 3a separated and transferred from the metal particulate 3b in the metal precursor vaporization system 2 and collected in the precursor collection system 7. According to an embodiment of the invention, the precursor collection system 7 can be maintained at a lower temperature than the metal precursor vaporization system 2 during the transfer process, in order to adsorb the $Ru_3(CO)_{12}$ precursor 3a onto the interior surfaces of the precursor collection system 7. In one example, the metal precursor vaporization system 2 can be maintained at a temperature between about 50° C. and about 150° C., while the precursor collection system 7 can be maintained at a temperature lower than about 40° C.

According to an embodiment of the invention, the pumping system 8 can be utilized to evacuate the metal precursor vaporization system 2 and the precursor collection system 7 during the transfer process. Thus, the pumping system 8 can remove the CO-containing gas flowing from the precursor vaporization system 2 to the precursor collection system 7 during the transfer process. According to another embodiment of the invention, the pumping system 8 can be turned off during the transfer process. It will be clear to one skilled in the art that the purifying system 14 in FIGS. 1A and 1B can be configured with any number of valves, regulators and/or flow meters (not shown) for measuring and controlling a flow of the CO-containing gas.

According to an embodiment of the invention, the precursor vaporization system 2 and the collection systems 7 can be have large surface areas for accommodating large amounts of metal carbonyl precursor. Such precursor collection systems are, for example, described in co-pending U.S. patent application Ser. No. 10/998,420, entitled MULTI-TRAY FILM PRECURSOR EVAPORATION SYSTEM AND THIN FILM DEPOSITION SYSTEM INCORPORATING THE SAME, the entire content of which is incorporated by reference.

After the precursor 3a is separated and transferred to the precursor collection system 7, the metal particulate impurity 3b can then be removed from the metal precursor vaporization system 2. Ideally, the removed metal particulate impurity 3b would be recycled. The precursor 3a residing in the precursor collection system 7 can now be used as a purified metal carbonyl precursor during processing in the process chamber 13, for example. In one embodiment, the precursor 3a can be transferred back to metal precursor vaporization system 2 and the purifying process repeated, for example, via delivery line 6 or by some other transfer means, such as another delivery line (not shown), or by simply opening the precursor collection system 7 and the metal precursor vaporization system 2 and transferring (e.g., pouring) the precursor 3a from the precursor collection system 7 to the metal precursor vaporization system 2.

In another embodiment, depicted in FIG. 1C, precursor collection system 7 can be used as a metal precursor vaporization system coupled to process chamber 13, and metal precursor vaporization system 2 can be used as a precursor collection system. Thus, in this embodiment, systems 2 and 7 are interchangeable (denoted by system 7,2 and system 2,7), each having a coupling to the process chamber 13, a gas source 4, feed lines 4a and/or 4b, and a vacuum pumping system 8. It may be appreciated that in this embodiment, systems 7,2 may be used as the metal precursor vaporization system for the purification process where the precursor 3a in system 7,2 does not yet contain a desired low level of metal particulate impurity 3b. Alternately, if precursor 3a in system 7,2 does contain a desired low level of metal particulate impurity 3b, then processing in chamber 13 may be performed by utilizing the purified metal carbonyl precursor 3a. In one embodiment, the precursor 3a can be transferred back and forth between the systems 2,7 and 7,2 a plurality of times, where during each transfer, the precursor 3a is further purified, until the precursor 3a contains a desired low level of metal particulate impurity 3b. After each transfer, the metal particulate impurity 3b can be removed from the starting system. As described above, the CO-containing carrier gas suppresses decomposition of the metal carbonyl precursor and allows for efficient transfer of the metal carbonyl precursor.

The temperature control system 5 is configured to change to relative temperatures of the systems 2,7 and 7,2, depending on which is being used as the metal precursor vaporization system 7. In one embodiment, temperature control system 5 is configured to heat system 7,2 to a temperature for vaporizing un-reacted precursor 3a and to maintain system 2,7 at a lower temperature for collecting the vapor of the precursor 3a from system 7,2. When the systems are switched, temperature control system 5 is then re-configured to heat system 2,7 to a temperature for vaporizing precursor 3a and to maintain system 7,2 at a lower temperature for collecting the vapor of the precursor 3a from system 2,7. Control system 9 is configured to control the temperature control system 5 to enable the switching between systems and operating temperatures.

Figure 2:
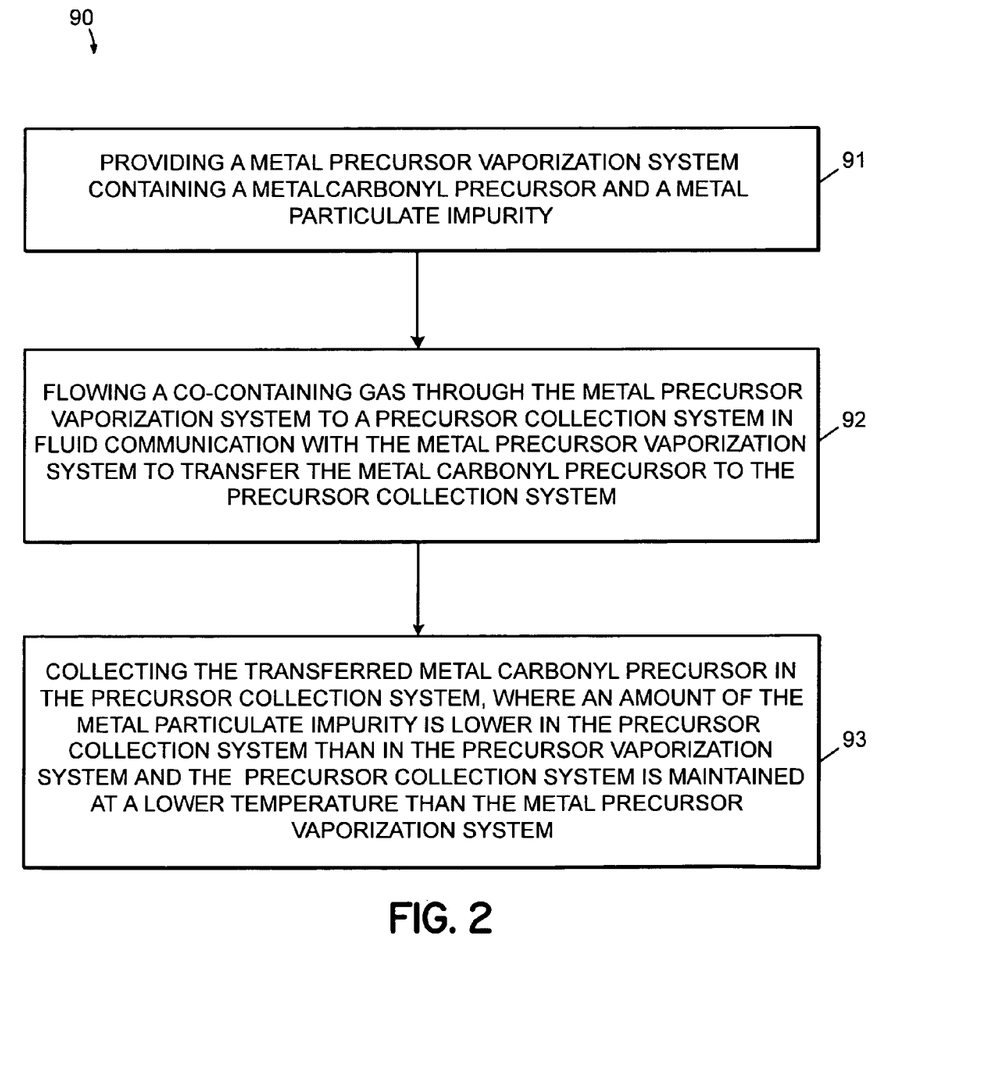
FIG. 2 is flowchart illustrating a method of purifying a metal carbonyl precursor according to an embodiment of the invention.

FIG. 2 is a flowchart illustrating a method of purifying a metal carbonyl precursor according to an embodiment of the invention. Referring also to FIGS. 1A-1C, the process 90 includes, in step 91, providing a metal precursor vaporization system 2 containing a metal carbonyl precursor 3a comprising a metal particulate impurity 3b. According to embodiments of the invention, the metal carbonyl precursor 3a may contain a solid metal carbonyl precursor, a liquid metal-containing precursor, or a combination thereof. According to an embodiment of the invention, the step 91 can further include heating the metal precursor vaporization system 2 to a desired temperature to vaporize the metal carbonyl precursor 3a in the metal precursor vaporization system 2.

In step 92, a CO-containing gas is flowed through the metal-precursor vaporization system 2 to the precursor collection system 7 to transfer the vapor of the metal carbonyl precursor 3a to the precursor collection system 7. The CO-containing gas is supplied from a gas source 4 to flow through and/or over the metal carbonyl precursor 3a. According to an embodiment of the invention, the CO-containing gas can further contain an inert gas, for example a noble gas such as He, Ne, Ar, Kr, or Xe. A flow of the CO-containing gas can, for example, be between about 0.1 sccm and about 1000 sccm.

In step 93, the transferred metal carbonyl precursor 3a is collected in the precursor collection system 7, where the precursor collection system 7 is maintained at a lower temperature than the metal precursor vaporization system 2. According to an embodiment of the invention, the metal carbonyl precursor can be a $Ru_3(CO)_{12}$ precursor and the temperature of the metal precursor vaporization system can be maintained at a temperature between about 50° C. and about 150° C.

As would be appreciated by those skilled in the art, each of the steps or stages in the flowchart of FIG. 2 may encompass one or more separate steps and/or operations. Accordingly, the recitation of only three steps in 91, 92, 93 should not be understood to limit the method of the present invention solely to three steps or stages. Moreover, each representative step or stage 91, 92, 93 should not be understood to be limited to only a single process. In one embodiment, for example, the method further includes, after transferring the precursor 3a to precursor collection system 7, removing the metal particulate impurity 3b from the metal precursor vaporization system 2. An optional cleaning process may be performed, using solvents, for example, to ensure complete removal of all residue of metal particulate impurity 3b. Thereafter, the method may further include transferring the precursor 3a back to the metal precursor vaporization system 2 to repeat the purifying process.

Embodiments of the invention further include a method of monitoring status of a metal carbonyl precursor in a metal precursor vaporization system, where the status of the metal carbonyl precursor can be utilized to decide when to purify the metal carbonyl precursor.

Figure 3:
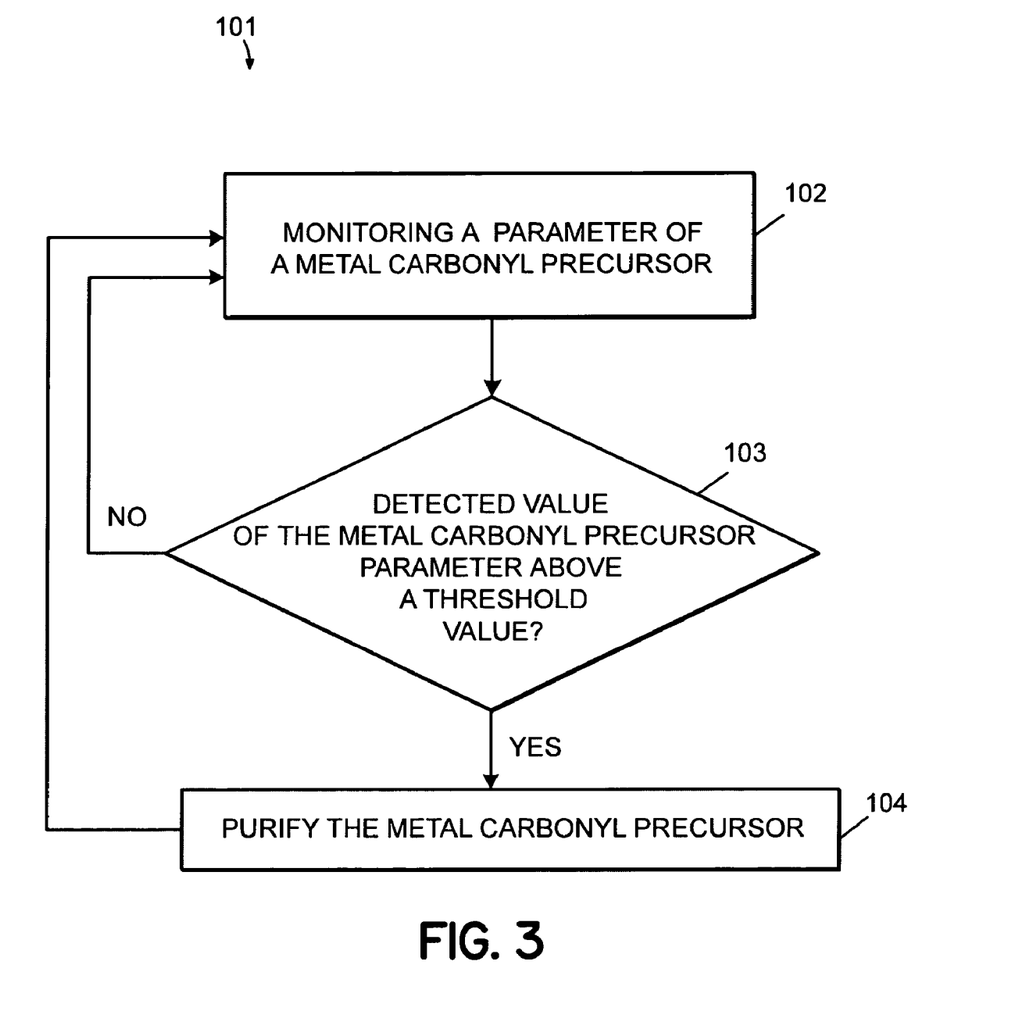
FIG. 3 is a flowchart showing a method of monitoring status of a metal carbonyl precursor according to an embodiment of the invention.

FIG. 3 is a flowchart showing a method of monitoring status of a metal carbonyl precursor according to an embodiment of the invention. The process 101 includes, in step 102, monitoring a parameter of a metal carbonyl precursor in a metal precursor vaporization system. The parameter can, for example, include the number of metal particulate impurities accumulated on a substrate in a CVD process utilizing the metal carbonyl precursor. The number of accumulated metal particulate impurities on the substrate can be determined following removal of the processed substrate from the process chamber. Analytical equipment for counting and analyzing particulates on substrates, such are 200 mm and 300 mm Si wafers, are well known to those skilled in the art.

In step 103, if the detected value of the metal carbonyl parameter (e.g., number and/or size of metal particulate impurities on a processed substrate) is not above a threshold value, the monitoring is continued in step 102. If a threshold value has been reached in step 103, indicating that the metal carbonyl precursor may need to be purified, a decision is made in step 103 whether to continue the monitoring in step 102, or to stop the monitoring and purify the metal carbonyl precursor in step 104. The purifying can subsequently be carried out using the method described in FIGS. 1A-1B and FIG. 2.

Figure 4:
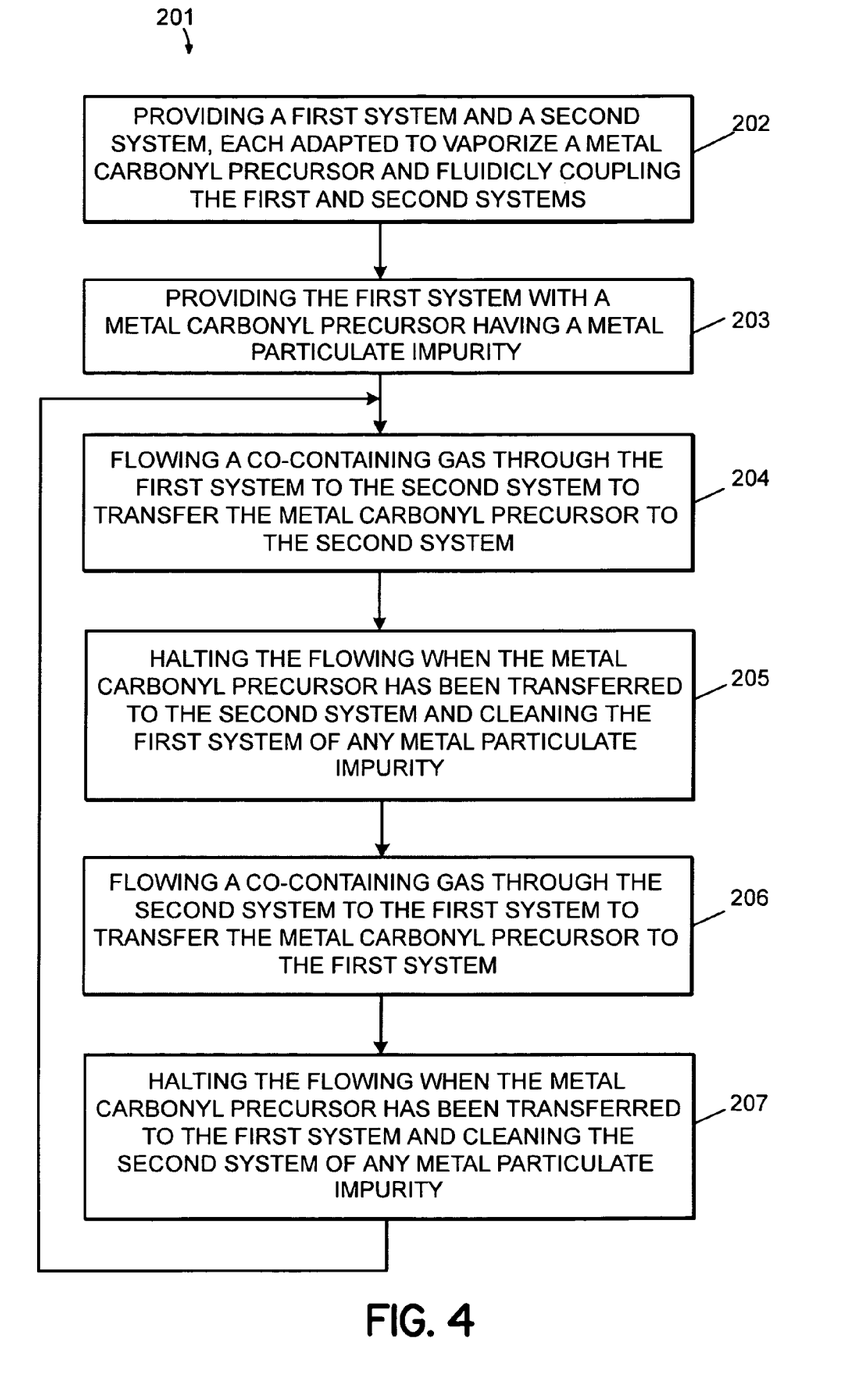
FIG. 4 provides a flowchart depicting a method for purifying a metal carbonyl precursor in repeated evaporation/collection steps in accordance with an embodiment of the present invention.

FIG. 4 provides a flowchart depicting a method 201 for purifying a metal carbonyl precursor in repeated evaporation/collection steps in accordance with an embodiment of the present invention. The method may be used, for example, in conjunction with the system 14' depicted in FIG. 1C. In step 202, the method includes providing a first system and a second system, where each system is adapted to evaporate a metal carbonyl precursor and the first system (e.g., system 2,7) and the second system (e.g., system 7,2) are fluidicly coupled. Each system is furthermore adapted to evaporate a metal carbonyl precursor for delivery to a process chamber for processing one or more substrates.

In step 203, the method includes providing the first system with a metal carbonyl precursor having a metal particulate impurity.

In step 204, the purifying process is carried out by flowing a CO-containing gas through the first system to the second system to transfer the metal carbonyl precursor to the second system. The metal particulate impurity substantially remains in the first system during the transfer.

In step 205, the flowing of the CO-containing gas and the transfer of the metal carbonyl precursor is halted when the metal carbonyl precursor has been transferred to the second system, and the first system is then cleaned of any metal particulate impurity. The cleaning process can, for example, use a wet solvent to remove all the metal particulate impurity from the first system. The metal carbonyl in the second system may now be used as a purified metal carbonyl precursor for processing one or more substrates in process chamber 13 or further purified in step 206.

In step 206, the purifying process is repeated by flowing a CO-containing gas through the second system to the first system to transfer the metal carbonyl precursor to the first system. Any metal particulate impurity substantially remains in the second system during the transfer.

In step 207, the flowing of the CO-containing gas and the transfer of the metal carbonyl precursor is halted when the metal carbonyl precursor has been transferred to the first system, and the second system is then cleaned of any metal particulate impurity. The metal carbonyl in the first system may now be used a purified metal carbonyl precursor for processing one or more substrates in process chamber 13 or further purified.

The purifying process may be repeated as many times as desired, by repeating steps 204-207. The monitoring process 101, depicted in FIG. 3, can be used to determine whether the purifying process needs to be carried out or repeated. In this regard, one or more test substrates may be processed in the process chamber 13 and accumulated metal particulate impurities counted and analyzed to determine if the further purifying is needed. As depicted in FIG. 1C, the first or the second system may be used for processing one or more substrates in the process chamber 13.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of purifying a metal carbonyl precursor in a metal precursor vaporization system where the metal carbonyl precursor comprises a metal particulate impurity, the method comprising:

flowing a CO-containing gas through the metal precursor vaporization system to a precursor collection system in fluid communication with the metal precursor vaporization system to separate the metal carbonyl precursor from the metal particulate impurity and to transfer the metal carbonyl precursor to the precursor collection system, wherein the metal particulate impurity includes at least one metal that is different from the metal of the metal carbonyl precursor; and collecting the transferred metal carbonyl precursor in the precursor collection system, wherein an amount of the metal particulate impurity is lower in the precursor collection system than in the precursor vaporization system and the precursor collection system is maintained at a lower temperature than the metal precursor vaporization system.

2. The method according to claim 1, wherein the metal carbonyl precursor comprises a solid, a liquid, or a combination thereof.

3. The method according to claim 1, further comprising:
heating the metal carbonyl precursor; and
vaporizing the metal carbonyl precursor to form precursor vapor in the metal precursor vaporization system, wherein the precursor vapor is transferred by the CO-containing gas to the precursor collection system.

4. The method according to claim 3, wherein the heating comprises heating the metal carbonyl precursor to a temperature between about 50° C. and about 150° C.

5. The method according to claim 1, wherein the CO-containing gas further comprises an inert gas.

6. The method according to claim 5, wherein the inert gas comprises $N_2$, a noble gas, or a combination thereof.

7. The method according to claim 1, wherein a flow of the CO-containing gas is between about 0.1 sccm and about 1000 sccm.

8. The method according to claim 1, further comprising:
removing the metal particulate impurity from the metal precursor vaporization system.

9. The method according to claim 1, further comprising:
evacuating the metal precursor vaporization system and the precursor collection system during the flowing and collecting.

10. The method according to claim 1, wherein the metal carbonyl precursor comprises a tungsten carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof.

11. The method according to claim 1, wherein the metal carbonyl precursor comprises $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

12. The method according to claim 1, wherein the metal particulate impurity comprises a transition metal element, an alkali metal element, or an alkali earth metal element, or a combination thereof.

13. The method according to claim 1, wherein the metal carbonyl precursor comprises $Ru_3(CO)_{12}$ and the metal particulate impurity comprises a metal different than Ru metal.

14. The method according to claim 1, further comprising:
processing a substrate in a process chamber by evaporating the metal carbonyl precursor in the precursor collection system and delivering the vapor of the metal carbonyl precursor to the process chamber by flowing a second CO-containing gas through the precursor collection system.

15. A computer readable medium containing program instructions for execution on a processor, which when executed by the processor, cause a precursor purifying system to perform the steps in the method recited in claim 1.

16. A method of processing one or more substrates using a metal carbonyl precursor, the method comprising:
purifying a metal carbonyl precursor in a metal precursor vaporization system where the metal carbonyl precursor comprises a first amount of a metal particulate impurity, wherein the metal particulate impurity includes at least one metal that is different from the metal of the metal carbonyl precursor, the purifying comprising:
flowing a first CO-containing gas through the metal precursor vaporization system to a precursor collection system in fluid communication with the metal precursor vaporization system to separate the metal carbonyl precursor from the metal particulate impurity and to transfer the metal carbonyl precursor to the precursor collection system,
collecting the metal carbonyl precursor in the precursor collection system, wherein a second amount of the metal particulate impurity in the precursor collection system is less than the first amount, and the precursor collection system is maintained at a lower temperature than the metal precursor vaporization system; and
processing a substrate in a process chamber by evaporating the metal carbonyl precursor in the precursor collection system and delivering the vapor of the metal carbonyl precursor to the process chamber by flowing a second CO-containing gas through the precursor collection system.

17. The method according to claim 16, wherein the flowing further comprises:
heating the metal carbonyl precursor; and
vaporizing the metal carbonyl precursor to form precursor vapor in the metal precursor vaporization system, wherein the precursor vapor is transferred by the first CO-containing gas to the precursor collection system.

18. The method according to claim 16, wherein the processing further comprises:
heating the metal carbonyl precursor; and
vaporizing the metal carbonyl precursor to form precursor vapor in the precursor collection system, wherein the precursor vapor is transferred by the second CO-containing gas to the process chamber.

19. A method of purifying a metal carbonyl precursor, the method comprising:
(a) providing a first system in fluid communication with a second system, the first and second systems each configured to evaporate a metal carbonyl precursor;
(b) providing the metal carbonyl precursor to the first system, where the metal carbonyl precursor comprises a metal particulate impurity, wherein the metal particulate impurity includes at least one metal that is different from the metal of the metal carbonyl precursor;
(c) flowing a first CO-containing gas through the first system to the second system to separate the metal carbonyl precursor from the metal particulate impurity and to transfer the metal carbonyl precursor to the second system;
(d) halting the flowing in step (c) when the metal carbonyl precursor has been transferred to the second system and cleaning the first system of any metal particulate impurity;
(e) flowing a second CO-containing gas through the second system to the first system to separate the metal carbonyl precursor from any metal particulate impurity and to transfer the metal carbonyl precursor to the first system;
(f) halting the flowing in step (e) when the metal carbonyl precursor has been transferred to the first system and cleaning the second system of any metal particulate impurity; and
(g) repeating steps (c) through (f) a desired number of times.

20. The method according to claim 19, wherein step (c) further comprises vaporizing the metal carbonyl precursor to form precursor vapor, wherein the precursor vapor is transferred by the first CO-containing gas, and step (f) further comprises vaporizing the metal carbonyl precursor to form precursor vapor, wherein the precursor vapor is transferred by the second CO-containing gas.

* * * * *

UNITED STATES PATENT AND TRADEMARK OFFICE
CERTIFICATE OF CORRECTION

| | | |
|---|---|---|
| PATENT NO. | : 7,459,395 B2 | Page 1 of 1 |
| APPLICATION NO. | : 11/238501 | |
| DATED | : December 2, 2008 | |
| INVENTOR(S) | : Kenji Suzuki | |

It is certified that error appears in the above-identified patent and that said Letters Patent is hereby corrected as shown below:

Col. 5, line 28, "$Ru_3CO_{12}$" should read --$Ru_3(CO_{12})$--.

Col. 5, line 30, "$Ru_3CO_{12}$" should read --$Ru_3(CO_{12})$--.

Col. 5, line 39, "coupled to an vaporization" should read --coupled to a vaporization--.

Col. 5, line 47, "$Ru_3CO_{12}$" should read --$Ru_3(CO_{12})$--.

Col. 5, line 63, "$Ru_3CO_{12}$" should read --$Ru_3(CO_{12})$--.

Col. 6, line 61, "window, can results" should read --window can result--.

Col. 7, line 9, "Equation. (1)" should read --Equation (1)--.

Col. 7, lines 47-48, "systems 7 can be have" should read --systems 7 can have--.

Col. 9, line 40, "such are 200 mm" should read --such as 200 mm--.

Col. 10, line 26, "used a purified" should read --used as a purified--.

Signed and Sealed this

Third Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,459,395 B2  Page 1 of 1
APPLICATION NO. : 11/238501
DATED : December 2, 2008
INVENTOR(S) : Kenji Suzuki It is certified that error appears in the above-identified patent and that said Letters Patent is hereby corrected as shown below:

Col. 5, line 28, "$Ru_3CO_{12}$" should read --$Ru_3(CO)_{12}$--.

Col. 5, line 30, "$Ru_3CO_{12}$" should read --$Ru_3(CO)_{12}$--.

Col. 5, line 39, "coupled to an vaporization" should read --coupled to a vaporization--.

Col. 5, line 47, "$Ru_3CO_{12}$" should read --$Ru_3(CO)_{12}$--.

Col. 5, line 63, "$Ru_3CO_{12}$" should read --$Ru_3(CO)_{12}$--.

Col. 6, line 61, "window, can results" should read --window can result--.

Col. 7, line 9, "Equation. (1)" should read --Equation (1)--.

Col. 7, lines 47-48, "systems 7 can be have" should read --systems 7 can have--.

Col. 9, line 40, "such are 200 mm" should read --such as 200 mm--.

Col. 10, line 26, "used a purified" should read --used as a purified--.

This certificate supersedes the Certificate of Correction issued November 3, 2009.

Signed and Sealed this

Twenty-second Day of December, 2009

David J. Kappos
*Director of the United States Patent and Trademark Office*